(12) United States Patent
Ito (10) Patent No.: US 10,643,969 B2
(45) Date of Patent: May 5, 2020

(54) SEMICONDUCTOR MODULE AND METHOD FOR MANUFACTURING THE SAME

(71) Applicant: Mitsubishi Electric Corporation, Chiyoda-ku (JP)

(72) Inventor: Yusaku Ito, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/073,842

(22) PCT Filed: Jan. 31, 2017

(86) PCT No.: PCT/JP2017/003400
§ 371 (c)(1),
(2) Date: Jul. 30, 2018

(87) PCT Pub. No.: WO2017/145667
PCT Pub. Date: Aug. 31, 2017

(65) Prior Publication Data
US 2019/0043827 A1 Feb. 7, 2019

(30) Foreign Application Priority Data
Feb. 24, 2016 (JP) ................................. 2016-033111

(51) Int. Cl.
*H01L 23/00* (2006.01)
*H01L 23/48* (2006.01)
(Continued)

(52) U.S. Cl.
CPC .............. *H01L 24/85* (2013.01); *H01L 23/29* (2013.01); *H01L 23/31* (2013.01);
(Continued)

(58) Field of Classification Search
CPC combination set(s) only.
See application file for complete search history.

(56) References Cited

U.S. PATENT DOCUMENTS

2009/0290286 A1* 11/2009 Yun .......................... H01G 4/08
361/325
2012/0103416 A1* 5/2012 Kwon ............... H01L 31/02242
136/256
(Continued)

FOREIGN PATENT DOCUMENTS

JP  8-250538 A  9/1996
JP  10-199923 A  7/1998
(Continued)

OTHER PUBLICATIONS

International Search Report dated Apr. 25, 2017 in PCT/JP2017/003400 filed Jan. 31, 2017.
(Continued)

*Primary Examiner* — Nduka E Ojeh
(74) *Attorney, Agent, or Firm* — Oblon, McClelland, Maier & Neustadt, L.L.P.

(57) ABSTRACT

A semiconductor module includes: a semiconductor device having a front-side electrode; a bonding wire having a bonding portion bonded to the front-side electrode; a first sealing member; and a second sealing member. The first sealing member seals a portion where the front-side electrode and the bonding wire are bonded to each other. The second sealing member covers the first sealing member. The first sealing member is higher than the second sealing member in elastic modulus.

9 Claims, 10 Drawing Sheets

(51) Int. Cl.
*H01L 23/29* (2006.01)
*H01L 23/31* (2006.01)
*H01L 23/498* (2006.01)

(52) U.S. Cl.
CPC ...... *H01L 23/3135* (2013.01); *H01L 23/3178* (2013.01); *H01L 23/48* (2013.01); *H01L 24/05* (2013.01); *H01L 24/48* (2013.01); *H01L 24/49* (2013.01); *H01L 24/73* (2013.01); *H01L 23/498* (2013.01); *H01L 2224/04042* (2013.01); *H01L 2224/05557* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48472* (2013.01); *H01L 2224/48991* (2013.01); *H01L 2224/49111* (2013.01); *H01L 2224/49175* (2013.01); *H01L 2224/73265* (2013.01); *H01L 2224/85039* (2013.01); *H01L 2224/8592* (2013.01); *H01L 2224/85939* (2013.01); *H01L 2924/13055* (2013.01); *H01L 2924/13091* (2013.01); *H01L 2924/181* (2013.01); *H01L 2924/3512* (2013.01)

(56) References Cited

U.S. PATENT DOCUMENTS

2014/0264383 A1* 9/2014 Kajiwara ............ H01L 29/2003
257/77
2015/0228618 A1* 8/2015 Kawanabe .............. H01L 24/85
438/652

FOREIGN PATENT DOCUMENTS

| JP | 10199923 A | * | 7/1998 |
| JP | 2000-223623 A | | 8/2000 |
| JP | 2000223623 A | * | 8/2000 |
| JP | 2007-184315 A | | 7/2007 |
| JP | 2009-302261 A | | 12/2009 |
| JP | 2013-98456 A | | 5/2013 |
| WO | WO 2016/016970 A1 | | 2/2016 |

OTHER PUBLICATIONS

Japanese Office Action dated Oct. 3, 2017 in JP 2017-533978, 4 pages.

* cited by examiner

SEMICONDUCTOR MODULE AND METHOD FOR MANUFACTURING THE SAME

TECHNICAL FIELD

The present invention relates to a semiconductor module and a method for manufacturing the same, and particularly to a power semiconductor module including a power semiconductor device and a method for manufacturing the same.

BACKGROUND ART

A semiconductor module usually includes: a substrate having a conductive pattern; a semiconductor device having a back side bonded to the conductive pattern, and a front side provided with a front-side electrode; and a bonding wire bonded to the front-side electrode. The substrate, the semiconductor device, and the bonding wire are usually sealed with a sealing material, such as a thermosetting resin or a gelled resin.

One example of such a semiconductor module is described in PTD 1 (Japanese Patent Laying-Open No. 2009-302261). In the semiconductor module described in PTD 1, for the purpose of diffusion of heat generated from a semiconductor chip, a bonding portion between a bonding wire and a front-side electrode of a semiconductor device is coated with a coating layer having a high heat conductivity. The coating layer is copper (Cu) or the like formed by, for example, vapor deposition.

CITATION LIST

Patent Document

PTD 1: Japanese Patent Laying-Open No. 2009-302261

SUMMARY OF INVENTION

Technical Problem

The semiconductor module described in PTD 1, where the bonding portion between the bonding wire and the front-side electrode of the semiconductor device is coated with the coating layer having a high heat conductivity, can facilitate diffusion of heat generated in the semiconductor device.

The coating layer described in PTD 1 is, however, Cu or the like formed by, for example, vapor deposition. Therefore, the coating layer described in PTD 1 does not contribute to enhancement of strength of the bonding portion between the front-side electrode of the semiconductor device and the bonding wire. In other words, the semiconductor module described in PTD 1 does not provide any description or suggestion of prolonging the life of the bonding portion between the front-side electrode of the semiconductor device and the bonding wire.

The present invention has been made in view of the above problem of prior art. Specifically, the present invention provides a semiconductor module that allows a longer life of a bonding portion between a front-side electrode of a semiconductor device and a bonding wire.

Solution to Problem

A semiconductor module in the present invention includes: a semiconductor device having a front-side electrode; a bonding wire having a bonding portion bonded to the front-side electrode; a first sealing member; and a second sealing member. The first sealing member seals a portion where the front-side electrode and the bonding wire are bonded to each other. The second sealing member covers the first sealing member. The first sealing member is higher than the second sealing member in elastic modulus.

Advantageous Effects of Invention

According to the semiconductor module in the present invention, the life of the bonding portion between the front-side electrode of the semiconductor device and the bonding wire can be prolonged.

DESCRIPTION OF EMBODIMENTS

Embodiments are described below with reference to the drawings. Identical or equivalent components are denoted with identical reference characters in the drawings. Note that the embodiments described hereinafter may be combined at least partially in any way.

First Embodiment

A structure of a semiconductor module in a first embodiment is described hereinafter.

Figure 1:
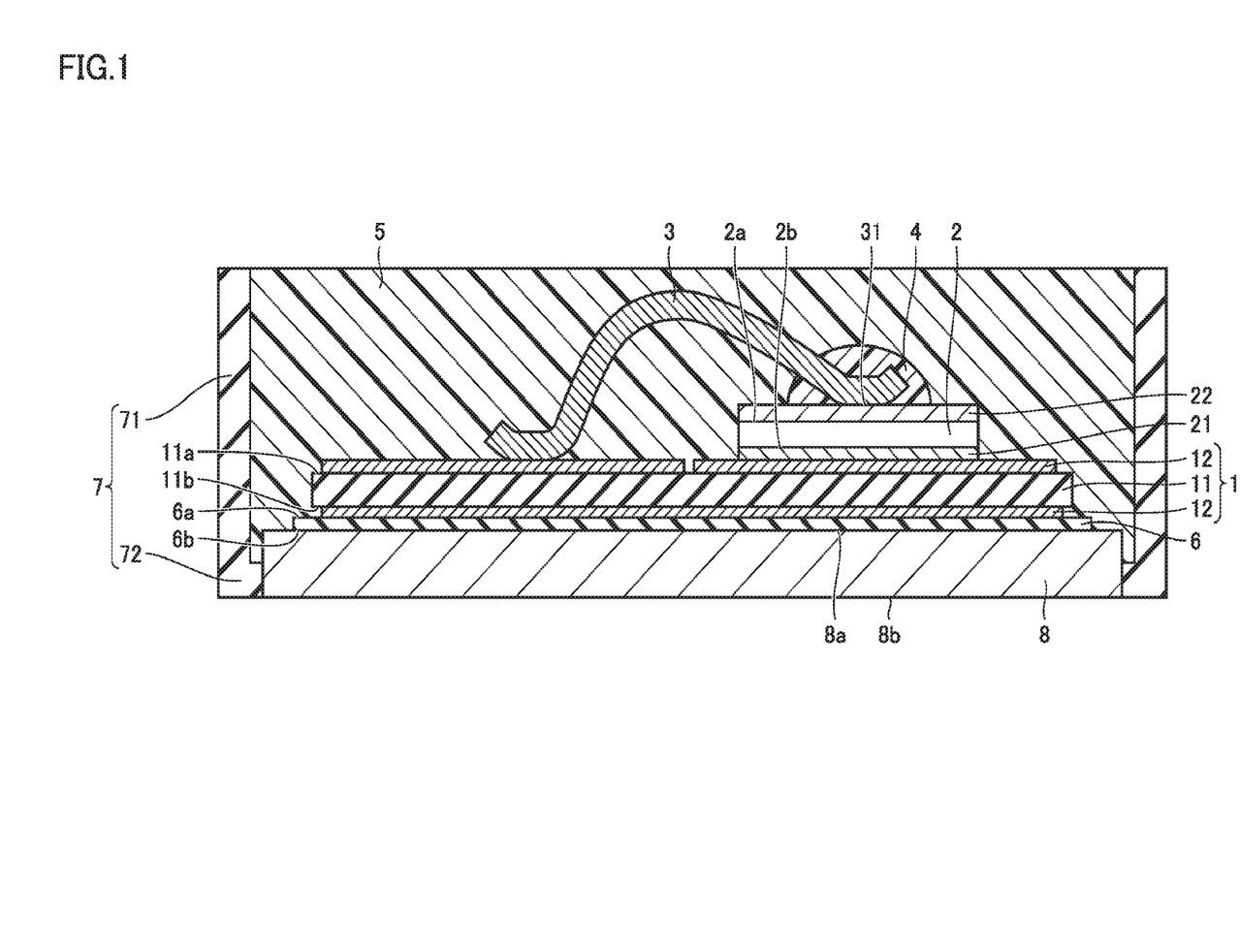
FIG. 1 is a cross-sectional view of a semiconductor module in a first embodiment.

FIG. 1 is a cross-sectional view of a semiconductor module in the first embodiment. As shown in FIG. 1, the semiconductor module in the first embodiment mainly includes an insulating substrate 1, a semiconductor device 2, a bonding wire 3, a first sealing member 4, and a second sealing member 5.

The semiconductor module in the first embodiment may further include a base board 6, a case 7, and a heat sink 8.

Insulating substrate 1 in the first embodiment has an insulating layer 11 and a conductive pattern 12. Insulating layer 11 has a front side 11a and a back side 11b. Back side 11b is a side opposite to front side 11a. For example, alumina ($Al_2O_3$), aluminum nitride (AlN), or the like is used for insulating layer 11.

Conductive pattern 12 is formed on insulating layer 11, on each of front side 11a and back side 11b. For example, copper (Cu) is used for conductive pattern 12. Semiconductor device 2 has a front side 2a and a back side 2b. Back side 2b is a side opposite to front side 2a. Semiconductor device 2 is, for example, a power semiconductor device having a vertical structure where a current flows from front side 2a to back side 2b. Semiconductor device 2 is, for example, a switching device such as an insulated gate bipolar transistor (IGBT) and a vertical metal oxide semiconductor field effect transistor (MOSFET), or a rectifying device such as a schottky-barrier diode.

Semiconductor device 2 is formed of, for example, a single crystal of silicon (Si). A semiconductor material constituting semiconductor device 2 is, however, not limited to this. For example, it may be a semiconductor material having a wide band gap, such as silicon carbide (SiC) and silicon nitride (GaN).

Semiconductor device 2 has a back-side electrode 21. Back-side electrode 21 is formed on back side 2b of semiconductor device 2. For example, an aluminum (Al) alloy containing Si or the like is used for back-side electrode 21. Back-side electrode 21 may have a coating layer. For example, nickel (Ni), gold (Au), or a structure where they are stacked is used for the coating layer.

Back-side electrode 21 is bonded to conductive pattern 12 on front side 11a of insulating substrate 1. Back-side electrode 21 and conductive pattern 12 on front side 11a are bonded to each other with a first bonding material (not shown) lying therebetween. For example, solder, sintering silver particles, or the like is used as the first bonding material.

Semiconductor device 2 has a front-side electrode 22. Front-side electrode 22 is formed on front side 2a of semiconductor device 2. For example, an Al alloy or the like containing Si is used for front-side electrode 22. Front-side electrode 22 may have a coating layer. For example, Ni, Au, or a structure where they are stacked is used for the coating layer.

Bonding wire 3 has a bonding portion 31. Bonding wire 3 bonds to front-side electrode 22 at bonding portion 31. For example, Au, Al, Cu, or the like is used for bonding wire 3. Bonding portion 31 has a periphery 32. In some cases, bonding wire 3 and front-side electrode 22 form a notch shape at periphery 32 of bonding portion 31.

Figure 2:
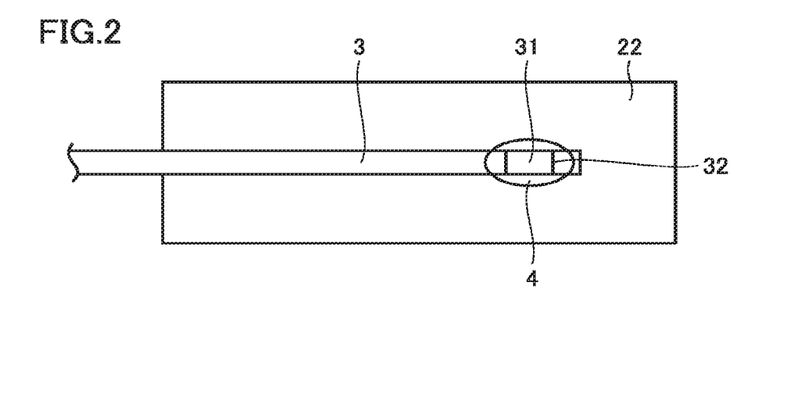
FIG. 2 is a top view of a front-side electrode of a semiconductor module in the first embodiment.

First sealing member 4 seals bonding portion 31. FIG. 2 is a top view of front-side electrode 22 of the semiconductor module in the first embodiment. As shown in FIG. 1 and FIG. 2, an area around bonding portion 31 of bonding wire 3 is covered with first sealing member 4.

Figure 3:
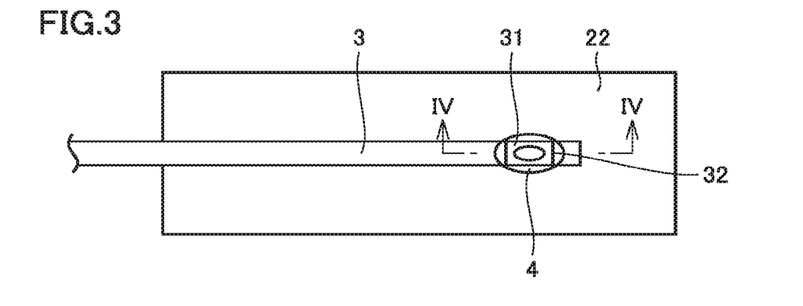
FIG. 3 is a top view of a front-side electrode of a semiconductor module in a first variation of the first embodiment.
Figure 4:
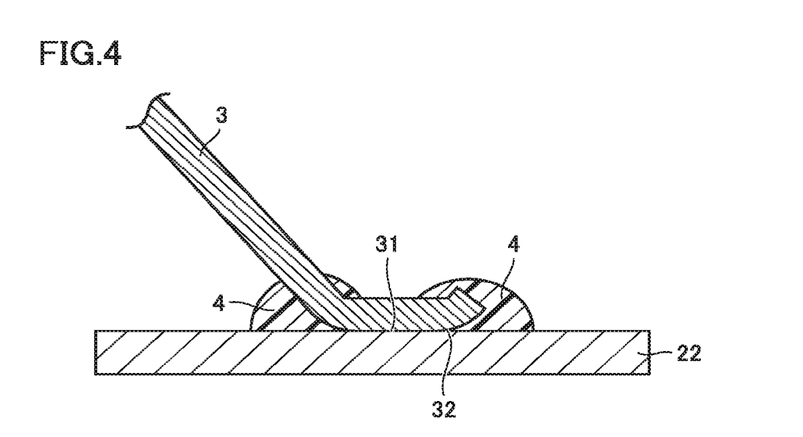
FIG. 4 is a cross-sectional view of a front-side electrode of a semiconductor module in the first variation of the first embodiment.

However, first sealing member 4 does not necessarily need to completely cover an area around bonding portion 31 of bonding wire 3. FIG. 3 is a top view of front-side electrode 22 of a semiconductor module in a first variation of the first embodiment. FIG. 4 is a cross-sectional view taken along IV-IV of FIG. 3. As shown in FIG. 3 and FIG. 4, in the first variation of the first embodiment, an area above bonding portion 31 of bonding wire 3 is not covered with first sealing member 4. However, in the first variation of the first embodiment, a space between bonding wire 3 and front-side electrode 22 is filled with first sealing member 4 at periphery 32 of bonding portion 31.

Figure 5:
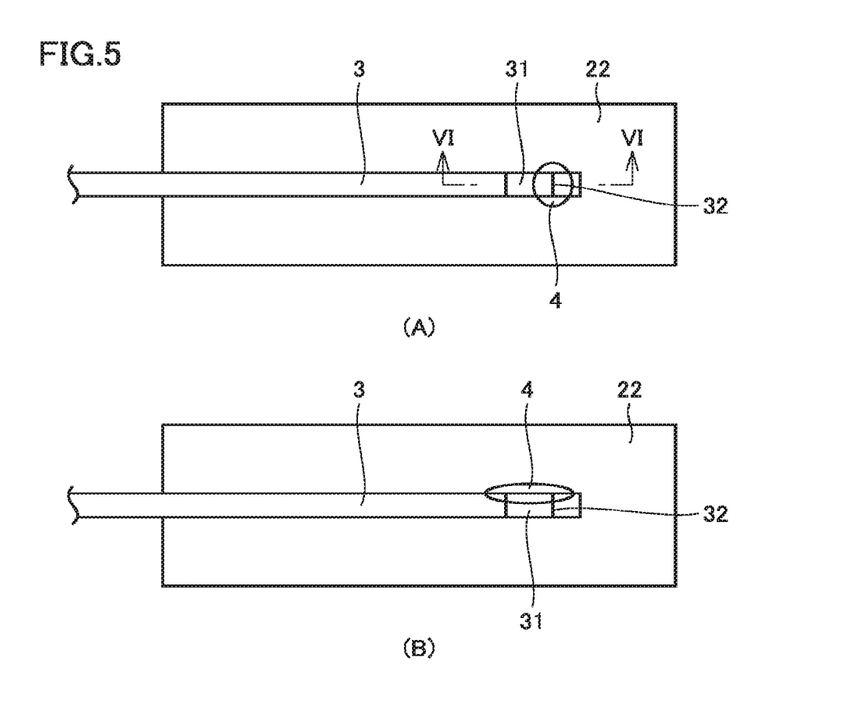
FIG. 5 is a top view of a front-side electrode of a semiconductor module in a second variation of the first embodiment.
Figure 6:
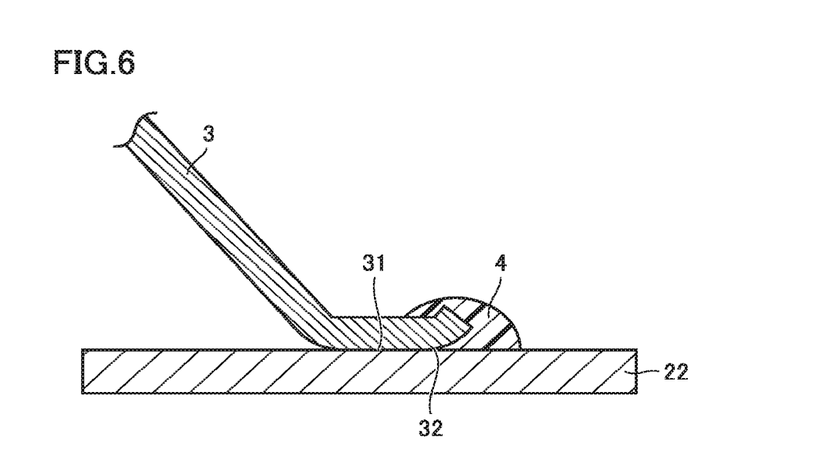
FIG. 6 is a cross-sectional view of a front-side electrode of a semiconductor module in the second variation of the first embodiment.

First sealing member 4 does not necessarily need to fill the space between bonding wire 3 and front-side electrode 22 over the entire periphery 32 of bonding portion 31. FIG. 5 is a top view of front-side electrode 22 of a semiconductor module in a second variation of the first embodiment. FIG. 6 is a cross-sectional view taken along VI-VI of FIG. 5 (A). As shown in FIG. 5 and FIG. 6, in the second variation of the first embodiment, a space between bonding wire 3 and front-side electrode 22 is filled with first sealing member 4 at a part of periphery 32 of bonding portion 31. In this way, first sealing member 4 has only to fill the space between bonding wire 3 and front-side electrode 22 for at least a part of periphery 32 of bonding portion 31.

Figure 7:
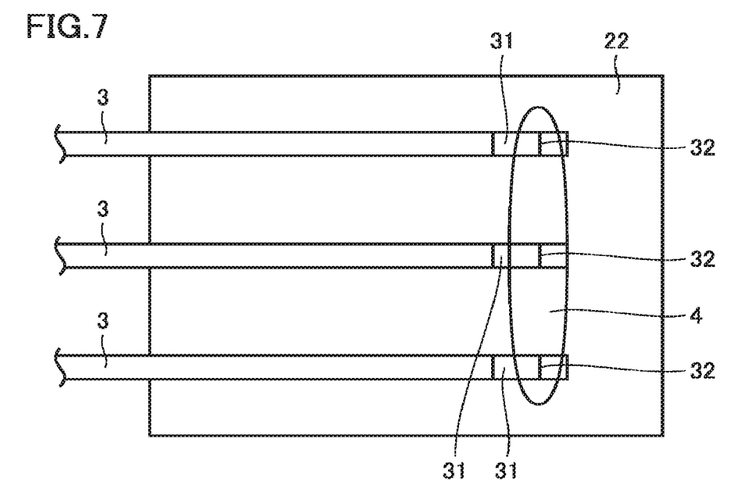
FIG. 7 is a top view of a front-side electrode of a semiconductor module in a third variation of the first embodiment.

FIG. 7 is a top view of a front-side electrode of a semiconductor module in a third variation of the first embodiment. As shown in FIG. 7, in the third variation of the first embodiment, a plurality of bonding portions 31 are collectively sealed with first sealing member 4. In such a case, all the bonding portions 31 may be collectively sealed with first sealing member 4. Alternatively, some of all the bonding portions 31 may be collectively sealed with first sealing member 4.

First sealing member 4 is higher than second sealing member 5 in elastic modulus. It is preferred that first sealing member 4 be substantially equal to bonding wire 3 in elastic modulus. More specifically, first sealing member 4 preferably has an elastic modulus of 70 GPa or more.

As first sealing member 4, a resin having a high elastic modulus may be used, for example. A resin to be used as first sealing member 4 preferably has a high glass-transition temperature. Specifically, a resin to be used as first sealing member 4 preferably has a glass-transition temperature higher than the maximum operating temperature of the semiconductor module. Specifically, a resin to be used as first sealing member 4 preferably has a glass-transition temperature of 150° C. or more.

As a sealing member of the semiconductor device, an insulating material is usually used. However, in the semiconductor module in the first embodiment, not only an insulating material but also a conductive material may be used as first sealing member 4. That is, first sealing member 4 may be higher than second sealing member 5 in electric conductivity. This is because first sealing member 4 further sealed with second sealing member 5 ensures insulation between semiconductor device 2 and the conductive pattern and the like. Thus, first sealing member 4 is not limited to a resin material.

More specifically, a resin containing a filler may be used as first sealing member 4. The filler is, for example, a metal or ceramics. Further, for example, a metallic material may also be used as first sealing member 4. The metallic material to be used as first sealing member 4 is, for example, a solder such as a tin (Sn) alloy.

As shown in FIG. 1, the inside of the semiconductor module in the first embodiment is filled with second sealing member 5. More specifically, the area defined by base board 6 and case 7 is filled with second sealing member 5. Thus, insulating substrate 1, semiconductor device 2, and bonding wire 3 are sealed. Second sealing member 5, however, does not necessarily need to seal the entire insulating substrate 1, semiconductor device 2, and bonding wire 3. Second sealing member 5 has only to cover at least first sealing member 4.

Second sealing member 5 has insulation properties. Second sealing member 5 is preferably higher than first sealing member 4 in dielectric breakdown strength. More specifically, second sealing member 5 preferably has a dielectric breakdown strength of 10 kV (1 mm).

Second sealing member 5 is preferably low in elastic modulus. This can prevent second sealing member 5 from peeling off at the front side of semiconductor device 2 due to the difference in coefficient of thermal expansion. More specifically, second sealing member 5 preferably has an elastic modulus of 30 GPa or less. The material to be used for the second sealing member is, for example, a silicone gel.

Base board 6 has a front side 6a and a back side 6b. Back side 6b is a side opposite to front side 6a. Base board 6 is composed of a material having a high thermal conductivity. For example, Cu is used for base board 6. Front side 6a of base board 6 is bonded to conductive pattern 12 formed on back side 11b of insulating substrate 1. Conductive pattern 12 and base board 6 are bonded to each other with a second bonding material (not shown) lying therebetween. For example, a solder or sintering silver particles is used as the second bonding material.

Case 7 has a side wall 71 and a bottom portion 72. For example, polyphenylene sulfide (PPS), polybutylene terephthalate (PBT), or the like is used for case 7. Case 7 is bonded to front side 6a of base board 6 at bottom portion 72. Case 7 and base board 6 constitute a housing of the semiconductor module in the first embodiment.

Heat sink 8 has a front side 8a and a back side 8b. Back side 8b is a side opposite to front side 8a. Heat sink 8 is composed of a material having a high thermal conductivity. For example, Al is used for heat sink 8. Front side 8a of heat sink 8 is bonded to back side 6b of base board 6. Heat sink 8 and base board 6 are bonded to each other with a third bonding material (not shown) lying therebetween. The third bonding material is, for example, a heat-conductive grease.

The heat generated from semiconductor device 2 is transferred to heat sink 8 through insulating substrate 1 and base board 6. The heat transferred to heat sink 8 is dissipated to the outside of the semiconductor module in the first embodiment through back side 8b of heat sink 8.

A manufacturing process of the semiconductor module in the first embodiment will now be described hereinafter.

The manufacturing process of the semiconductor module in the first embodiment includes a bonding step S1, a first sealing step S2, and a second sealing step S3.

At bonding step S1, insulating substrate 1 is bonded to base board 6. At bonding step S1, semiconductor device 2 is bonded to insulating substrate 1. At bonding step S1, bonding wire 3 is wire-bonded to front-side electrode 22 of semiconductor device 2. Further, at bonding step S1, case 7 is bonded to base board 6. In this way, a semiconductor module structure before being sealed is formed.

Figure 8:
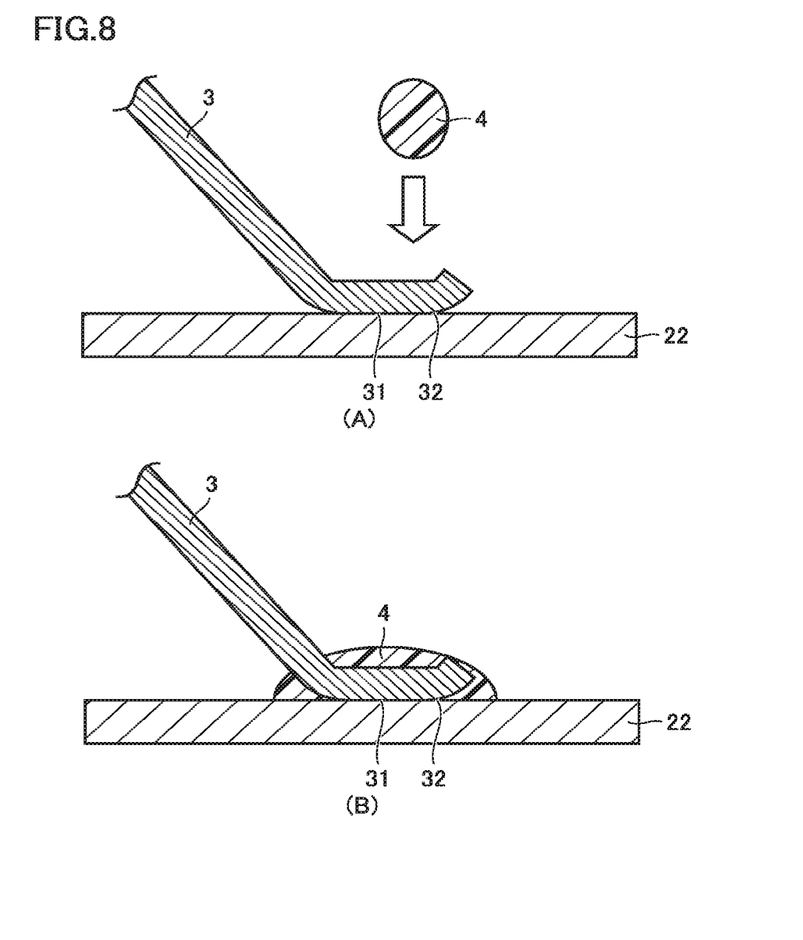
FIG. 8 is a cross-sectional view of a first sealing step for a semiconductor module in the first embodiment.

FIG. 8 is a cross-sectional view of first sealing step S2 for the semiconductor module in the first embodiment. At first sealing step S2, firstly, as shown in FIG. 8 (A), liquid first sealing member 4 is supplied to bonding portion 31. If first sealing member 4 is a resin, a mixture of a base resin and a hardening agent is dropped at and around bonding portion 31. If first sealing member 4 is a solder alloy, a solder melted by a soldering iron is supplied to bonding portion 31.

At first sealing step S2, secondly, the supplied liquid first sealing member 4 is hardened. If first sealing member 4 is a resin, the supplied liquid first sealing member 4 is hardened by, for example, being kept under a normal temperature. If first sealing member 4 is a solder alloy, the supplied liquid first sealing member 4 is hardened by being cooled. In this way, bonding portion 31 is sealed with first sealing member 4 as shown in FIG. 8 (B).

At second sealing step S3, liquid second sealing member 5 is supplied to the inside of the semiconductor module in the first embodiment defined by case 7 and base board 6. By hardening this liquid second sealing member 5, first sealing member 4, insulating substrate 1, semiconductor device 2, and bonding wire 3 are sealed as shown in FIG. 1.

The advantageous effects of the semiconductor module in the first embodiment are hereinafter described.

A thermal stress is repeatedly generated at bonding portion 31 between front-side electrode 22 and bonding wire 3 due to the difference in coefficient of thermal expansion between bonding wire 3 and semiconductor device 2. In some cases, bonding wire 3 and front-side electrode 22 form a notch shape at periphery 32 of bonding portion 31. Such a notch shape is easily subjected to stress concentration. Therefore, such a thermal stress easily concentrates at periphery 32 of bonding portion 31.

In the semiconductor module in the first embodiment, however, at least periphery 32 of bonding portion 31 between front-side electrode 22 and bonding wire 3 is sealed with first sealing member 4. Further, first sealing member 4 is higher than second sealing member 5 in elastic modulus.

Thus, in the semiconductor module in the first embodiment, stress concentration at periphery 32 of bonding portion 31 can be reduced. That is, according to the semiconductor module in the first embodiment, the occurrence and development of cracks at periphery 32 of bonding portion 31 can be reduced. This allows a still longer life of bonding portion 31.

If semiconductor device 2 is formed of a semiconductor material having a wide band gap, such as SiC or GaN, for example, there is a possibility that the semiconductor module will be used under high temperature. Under such high temperature, an ordinary sealing resin would lose its elasticity due to softening and deterioration.

If a metallic material or a resin containing a filler is used as first sealing member 4 in the semiconductor module in the first embodiment, first sealing member 4 can maintain its elasticity even under such high temperature, thus allowing a still longer life of bonding portion 31. This is because a metallic material or filler has less deterioration even under high temperature.

Second Embodiment

A structure of a semiconductor module in a second embodiment is described hereinafter. The difference from the first embodiment is mainly described here.

Similarly to the semiconductor module in the first embodiment, the semiconductor module in the second embodiment mainly includes insulating substrate 1, semiconductor device 2, bonding wire 3, first sealing member 4, and second sealing member 5. Similarly to the semiconductor module in the first embodiment, the semiconductor module in the second embodiment may further include base board 6, case 7, and heat sink 8.

The semiconductor module in the second embodiment is, however, different from the semiconductor module in the first embodiment in front-side electrode 22.

Figure 9:
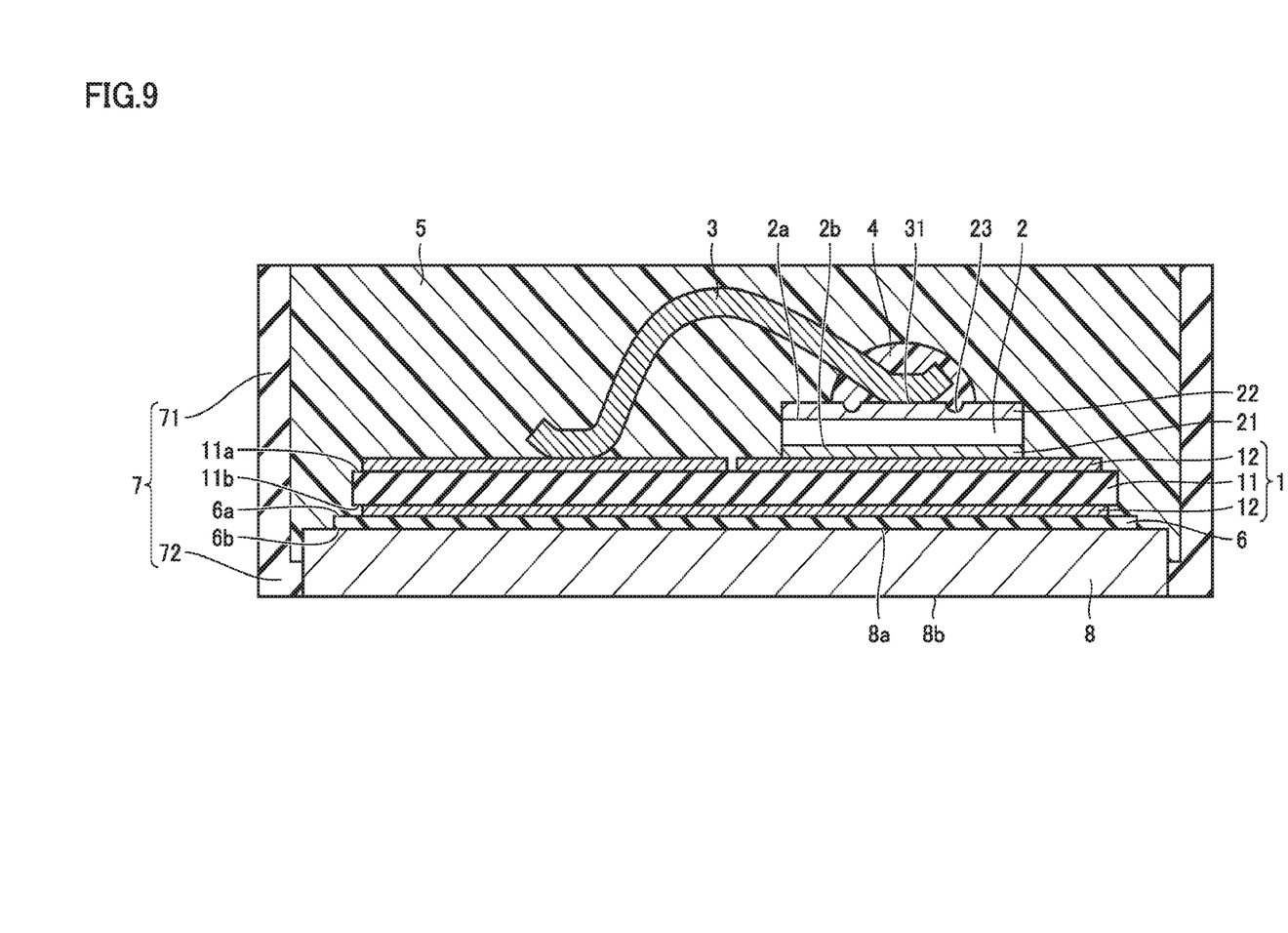
FIG. 9 is a cross-sectional view of a semiconductor module in a second embodiment.

FIG. 9 is a cross-sectional view of the semiconductor module in the second embodiment. As shown in FIG. 9, front-side electrode 22 of the semiconductor module in the second embodiment has a recess 23. Recess 23 is formed on a surface of front-side electrode 22. First sealing member 4 fills the space of at least a part of periphery 32 of bonding portion 31 and also fills recess 23.

Figure 10:
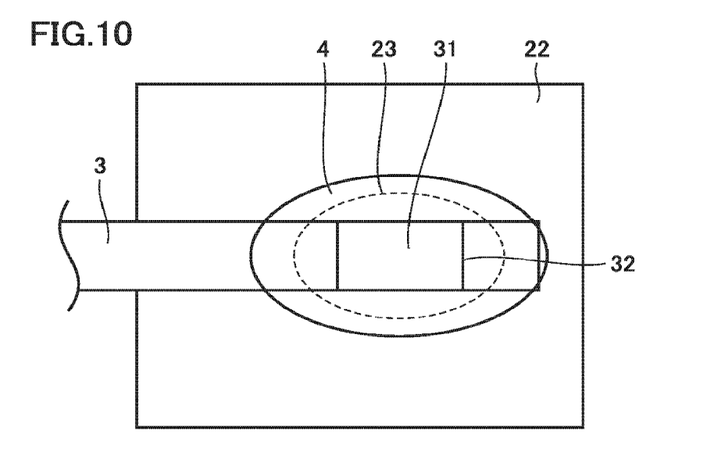
FIG. 10 is a top view of a front-side electrode of a semiconductor module in the second embodiment.

Recess 23 is formed around bonding portion 31 on front-side electrode 22. FIG. 10 is a top view of front-side electrode 22 of the semiconductor module in the second embodiment. As shown in FIG. 10, recess 23 may be formed continuously so as to surround bonding portion 31 on front-side electrode 22, for example.

Figure 11:
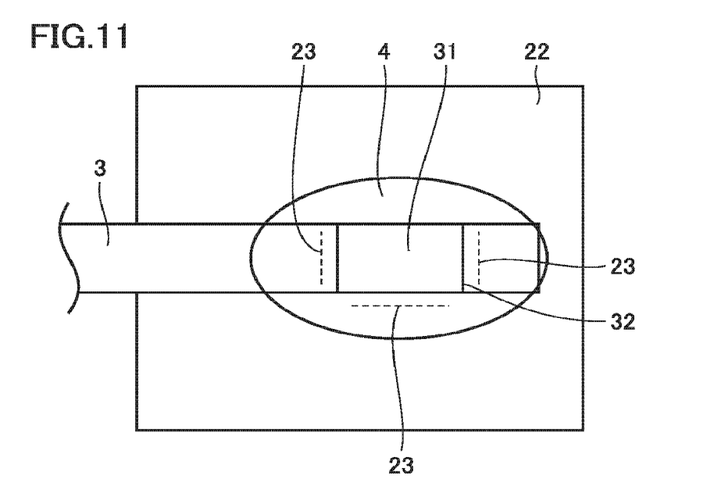
FIG. 11 is a top view of a front-side electrode of a semiconductor module in a first variation of the second embodiment.

FIG. 11 is a top view of front-side electrode 22 of a semiconductor module in a first variation of the second embodiment. As shown in FIG. 11, recess 23 may be formed so as to be divided into a plurality of parts. Note that there may be an area that lies around bonding portion 31 and that is not surrounded by recess 23. That is, recess 23 does not necessarily need to be formed on all sides of bonding portion 31, but may be formed only on a specific side thereof.

Figure 12:
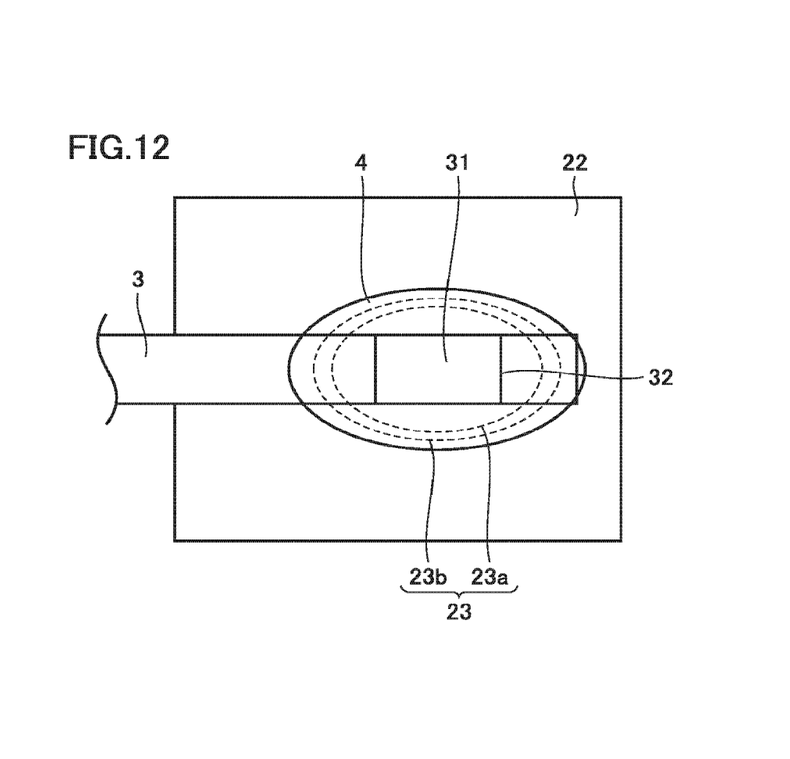
FIG. 12 is a top view of a front-side electrode of a semiconductor module in a second variation of the second embodiment.

FIG. 12 is a top view of front-side electrode 22 of a semiconductor module in a second variation of the second embodiment. As shown in FIG. 12, recess 23 includes a first recess 23a and a second recess 23b. First recess 23a is formed around bonding portion 31. Second recess 23b is formed on the outer side of first recess 23a. That is, second recess 23b is formed farther from periphery 32 of bonding portion 31 than first recess 23a is from periphery 32 of bonding portion 31. In this way, recess 23 may be formed so as to multiply surround bonding portion 31.

Figure 13:
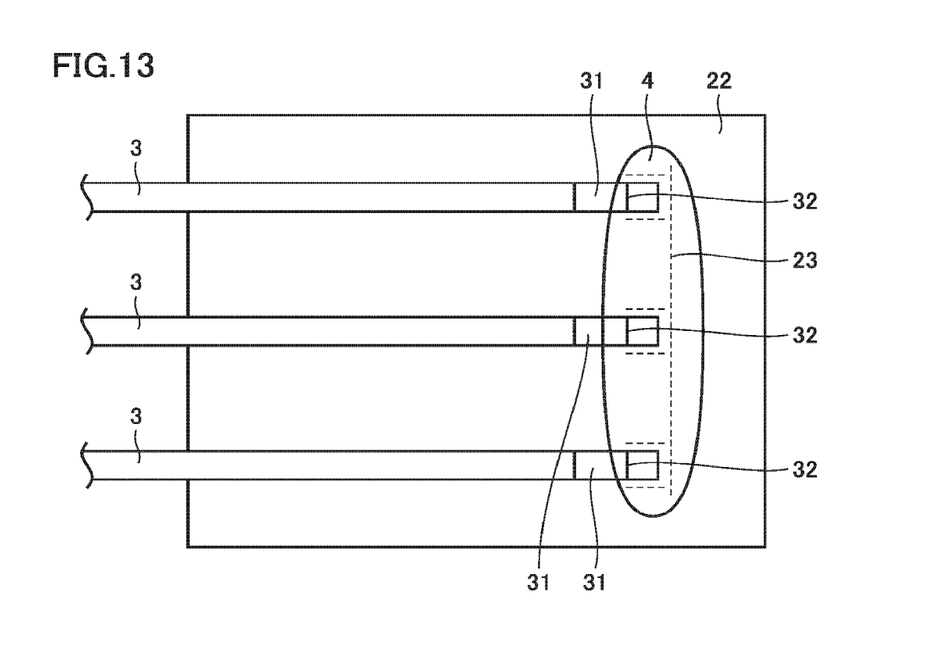
FIG. 13 is a top view of a front-side electrode of a semiconductor module in a third variation of the second embodiment.

FIG. 13 is a top view of front-side electrode 22 of a semiconductor module in a third variation of the second embodiment. As shown in FIG. 13, recess 23 may be formed so as to extend over areas around a plurality of bonding portions 31 on front-side electrode 22. In this way, recess 23 does not necessarily need to be individually formed for each bonding portion 31.

A method for manufacturing a semiconductor module in the second embodiment will now be described hereinafter.

Similarly to the method for manufacturing a semiconductor module in the first embodiment, the method for manufacturing a semiconductor module in the second embodiment includes bonding step S1, first sealing step S2, and second sealing step S3. In addition to these steps, the method for manufacturing a semiconductor module in the second embodiment further includes a recess formation step S4.

Figure 14:
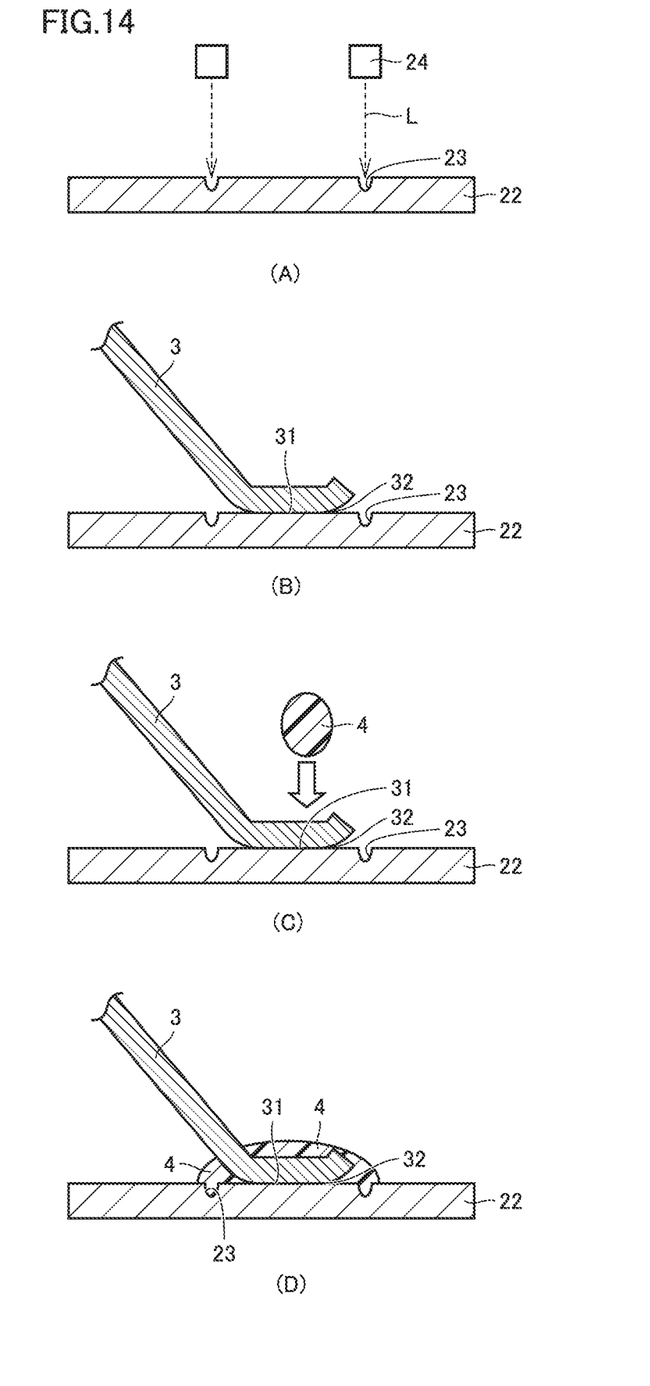
FIG. 14 is a cross-sectional view of a manufacturing process of a semiconductor module in the second embodiment.

FIG. 14 is a cross-sectional view of a manufacturing process of a semiconductor module in the second embodiment. In the manufacturing process of a semiconductor module in the second embodiment, recess formation step S4 is performed firstly. As shown in FIG. 14 (A), recess 23 is formed at recess formation step S4. The formation of recess 23 is performed by, for example, a laser beam L from a laser irradiation source 24 irradiating front-side electrode 22. Laser beam L irradiates an area around a portion to which bonding wire 3 is to be bonded to constitute bonding portion 31. Laser irradiation source 24 is, for example, a carbon dioxide laser processing machine.

After recess formation step S4, bonding step S1 and first sealing step S2 are performed as shown in FIG. 14 (B) to FIG. 14 (C). In first sealing step S2, first sealing member 4 fills not only the space at periphery 32 of bonding portion 31 but also recess 23, thereby sealing bonding portion 31. After first sealing step S2, second sealing step S3 is performed.

Figure 15:
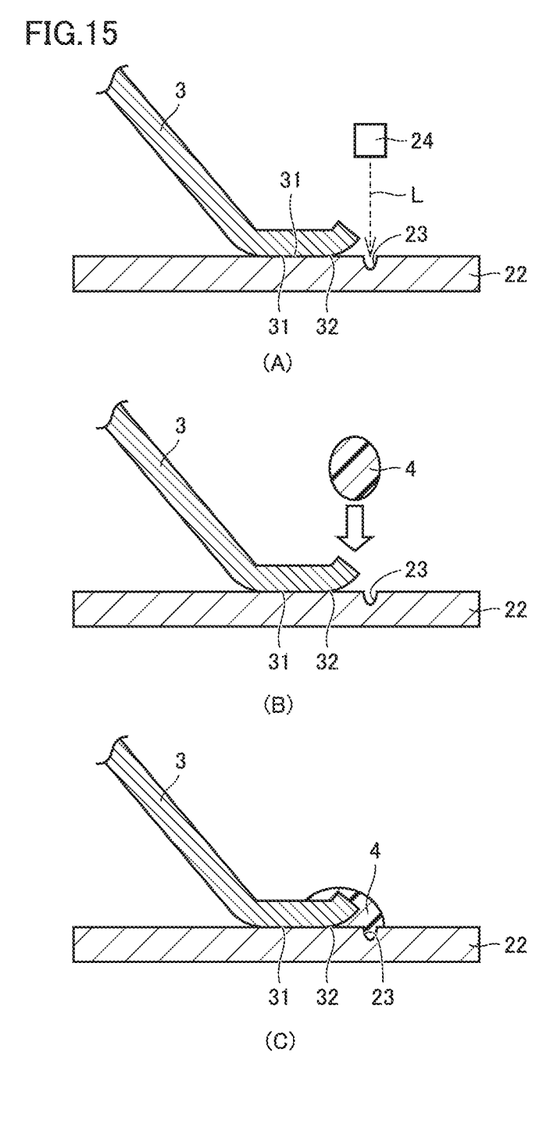
FIG. 15 is a cross-sectional view of a variation of the manufacturing process of a semiconductor module in the second embodiment.

The order of recess formation step S4 is not limited to the above. Recess formation step S4 may be performed after bonding step S1, for example. FIG. 15 is a cross-sectional view of a variation of the manufacturing process of a semiconductor module in the second embodiment. In the variation of the manufacturing process of a semiconductor module in the second embodiment, bonding step S1 is performed firstly. After bonding step S1, recess formation step S4 is performed as shown in FIG. 15 (A) to form recess 23 around periphery 32 of bonding portion 31. After recess formation step S4, first sealing step S2 is performed as shown in FIG. 15 (B) and FIG. 15(C). After first sealing step S2, second sealing step S3 is performed.

The advantageous effects of the semiconductor module in the second embodiment are hereinafter described.

As described above, a thermal stress is repeatedly generated at bonding portion 31 between front-side electrode 22 and bonding wire 3 due to the difference in coefficient of thermal expansion between bonding wire 3 and semiconductor device 2. This thermal stress easily causes stress concentration at periphery 32 of bonding portion 31. Accordingly, such a repeated thermal stress may progress peeling from the end of first sealing member 4 toward periphery 32 of bonding portion 31 along the interface between first sealing member 4 and front-side electrode 22.

In the semiconductor module in the second embodiment, recess 23 is provided on front-side electrode 22. The direction of progress of the above-mentioned peeling significantly changes at recess 23. Accordingly, in the semiconductor module in the second embodiment, front-side electrode 22 having recess 23 reduces the progress of peeling. As a result, the semiconductor module in the second embodiment allows a still longer life of bonding portion 31.

In the semiconductor module in the second embodiment, if recess 23 is multiply formed around bonding portion 31, the direction of progress of peeling significantly changes at a plurality of parts. In such a case, therefore, the progress of peeling is further reduced. As a result, the life of bonding portion 31 can further be prolonged.

Third Embodiment

A structure of a semiconductor module in a third embodiment is described hereinafter. The difference from the second embodiment is mainly described here.

Similarly to the semiconductor module in the second embodiment, the semiconductor module in the third embodiment mainly includes insulating substrate 1, semiconductor device 2, bonding wire 3, first sealing member 4, and second sealing member 5. Similarly to the semiconductor module in the second embodiment, the semiconductor module in the third embodiment may further include base board 6, case 7, and heat sink 8.

In the semiconductor module in the third embodiment, front-side electrode 22 has recess 23. In the semiconductor module in the third embodiment, however, the shape of recess 23 is different from that of the semiconductor module in the second embodiment.

Figure 16:
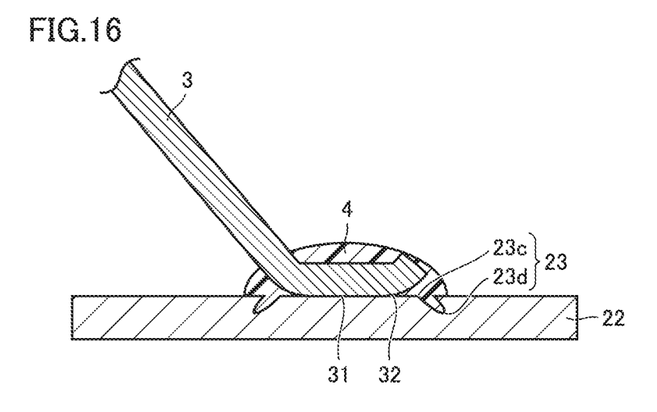
FIG. 16 is a cross-sectional view of a portion around a front-side electrode of a semiconductor module in a third embodiment.

FIG. 16 is a cross-sectional view of a portion around a front-side electrode of the semiconductor module in the third embodiment. As shown in FIG. 16, front-side electrode 22 has recess 23. Recess 23 is formed around periphery 32 of bonding portion 31 on front-side electrode 22. First sealing member 4 fills the space of at least a part of periphery 32 of bonding portion 31 and also fills recess 23.

Recess 23 has an opening 23c and a bottom 23d. Recess 23 inclines with respect to the direction perpendicular to a surface of front-side electrode 22. That is, the direction from bottom 23d to opening 23c is different from the direction perpendicular to the surface of the front-side electrode. More specifically, recess 23 preferably inclines in such a way that, in a plan view, bottom 23d is farther from bonding portion 31 than opening 23c is from bonding portion 31. Only a part of recess 23 may be inclined. The recess also has a side face. In a plan view, bottom 23d or at least a part of the side face is located farther from bonding portion 31 than opening 23c is from bonding portion 31.

A method for manufacturing a semiconductor module in the third embodiment will now be described hereinafter.

Similarly to the manufacturing process of a semiconductor module in the second embodiment, the manufacturing process of a semiconductor module in the third embodiment includes bonding step S1, first sealing step S2, second sealing step S3, and recess formation step S4. The manufacturing process of a semiconductor module in the third embodiment is, however, different from the manufacturing process of a semiconductor module in the second embodiment in recess formation step S4. The difference is hereinafter described.

Figure 17:
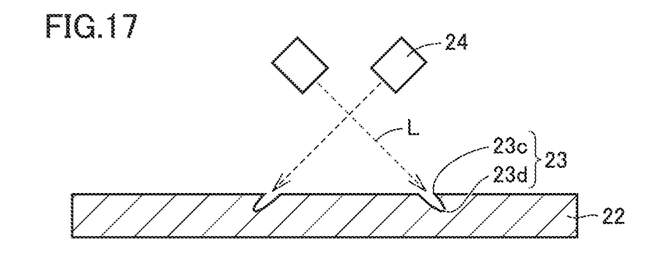
FIG. 17 is a cross-sectional view of a recess formation step for a semiconductor module in the third embodiment.

FIG. 17 is a cross-sectional view of recess formation step S4 in the third embodiment. As shown in FIG. 17, an inclined recess 23 is formed at recess formation step S4. Inclined recess 23 is formed by irradiating an area around a portion that will constitute bonding portion 31, with laser beam L inclined with respect to the direction perpendicular to a surface of front-side electrode 22. In order to incline laser beam L for irradiation with respect to the direction perpendicular to the surface of front-side electrode 22, laser irradiation source 24 may be arranged in an inclined manner, for example.

The advantageous effects of the semiconductor module in the third embodiment are hereinafter described.

As described above, a thermal stress repeatedly generated at bonding portion 31 between front-side electrode 22 and bonding wire 3 may progress peeling from the end of first sealing member 4 toward periphery 32 of bonding portion 31 along the interface between first sealing member 4 and front-side electrode 22.

In semiconductor module in the third embodiment, inclined recess 23 is formed on front-side electrode 22. The direction of progress of peeling is significantly changed at inclined recess 23. Therefore, in the semiconductor module in the third embodiment, front-side electrode 22 having inclined recess 23 further reduces the progress of peeling. As a result, the semiconductor module in the third embodiment allows a still longer life of bonding portion 31.

It should be understood that the embodiments disclosed herein are illustrative in every respect, not limitative. It is intended that the scope of the present invention is defined not by the above-described embodiments but by the terms of the claims, and it is intended that any modification within the meaning and scope equivalent to the claims is included.

REFERENCE SIGNS LIST

1: insulating substrate; 11: insulating layer; 11a: front side; 11b: back side; 12: conductive pattern; 2: semiconductor device; 2a: front side; 2b: back side; 21: back-side electrode; 22: front-side electrode; 23c: opening; 23d: bottom; 24: laser irradiation source; 3: bonding wire; 31: bonding portion; 32: periphery; 4: first sealing member; 5: second sealing member; 6: base board; 6a: front side; 6b: back side; 7: case; 8: heat sink; 8a: front side; 8b: back side; 71: side wall; 72: bottom portion; L: laser beam; S1: bonding step; S2: first sealing step; S3: second sealing step; S4: recess formation step

The invention claimed is:

1. A semiconductor module comprising:
a semiconductor device having a front-side electrode;
a bonding wire having a bonding portion bonded to the front-side electrode;
a first sealing member filling a space between the bonding wire and the front-side electrode at a periphery of the bonding portion and having a first elastic modulus; and
a second sealing member covering the first sealing member, the second sealing member being in direct contact with the front-side electrode, and having a second elastic modulus,
the first elastic modulus being higher than the second elastic modulus,
the front-side electrode having a recess around the bonding portion,
the recess being formed away from the bonding portion,
the recess being filled with the first sealing member,
the recess has an opening, a side face, and a bottom, and in a plan view, the bottom or at least a part of the side face is located farther from the bonding portion than the opening is from the bonding portion.

2. The semiconductor module according to claim 1, wherein, in a plan view, the recess is formed so as to surround the bonding portion.

3. The semiconductor module according to claim 2, wherein the recess is continuously formed.

4. The semiconductor module according to claim 1, wherein the first sealing member is higher than the second sealing member in electric conductivity.

5. The semiconductor module according to claim 1, wherein the first sealing member is lower than the second sealing member in dielectric breakdown strength.

6. The semiconductor module according to claim 1, wherein the first elastic modulus is 70 GPa or more.

7. The semiconductor module according to claim 1, wherein the second elastic modulus is 30 GPa or less.

8. A method for manufacturing a semiconductor module, the method comprising:
bonding a bonding wire to a front-side electrode of a semiconductor device to form a bonding portion;
filling a space between the bonding wire and the front-side electrode with a first sealing member having a first elastic modulus at a periphery of the bonding portion;
covering the first sealing member with a second sealing member having a second elastic modulus such that the second sealing member is in direct contact with the front-side electrode; and
forming a recess around the bonding portion,
the recess being formed away from the bonding portion,
the first elastic modulus being higher than the second elastic modulus,
the recess has an opening and a bottom, in a plan view, the bottom is located farther from the bonding portion than the opening is from the bonding portion, and
the laser beam irradiates the front-side electrode, with the laser beam being inclined.

9. The method for manufacturing a semiconductor module according to claim 8, wherein the recess is formed by a laser beam irradiating the front-side electrode.

* * * * *